United States Patent
Beghein et al.

(10) Patent No.: US 9,768,728 B2
(45) Date of Patent: Sep. 19, 2017

(54) REGENERATIVE FREQUENCY DIVIDER

(71) Applicant: MediaTek Singapore Pte. Ltd., Singapore (SG)

(72) Inventors: Christophe C. Beghein, West Malling (GB); Jonathan Richard Strange, Reigate (GB)

(73) Assignee: MediaTek Singapore Pte. Ltd., Singapore (SG)

(*) Notice: Subject to any disclaimer, the term of this patent is extended or adjusted under 35 U.S.C. 154(b) by 0 days.

(21) Appl. No.: 15/104,243

(22) PCT Filed: Nov. 12, 2015

(86) PCT No.: PCT/SG2015/050445
§ 371 (c)(1),
(2) Date: Jun. 14, 2016

(87) PCT Pub. No.: WO2016/076798
PCT Pub. Date: May 19, 2016

(65) Prior Publication Data
US 2016/0315623 A1 Oct. 27, 2016

Related U.S. Application Data

(60) Provisional application No. 62/078,581, filed on Nov. 12, 2014.

(51) Int. Cl.
*H03D 7/14* (2006.01)
*H03K 23/50* (2006.01)
*H03K 3/0231* (2006.01)
*H03K 23/44* (2006.01)

(52) U.S. Cl.
CPC ......... *H03D 7/1458* (2013.01); *H03K 3/0231* (2013.01); *H03K 23/44* (2013.01); *H03K 23/50* (2013.01)

(58) Field of Classification Search
CPC ...... H03K 23/44; H03K 23/50; H03K 3/0231; H03D 7/1458

(Continued)

(56) References Cited

U.S. PATENT DOCUMENTS 7,557,664 B1 7/2009 Wu
8,384,465 B2* 2/2013 Zanchi ................. H03F 1/3211
327/116

(Continued)

FOREIGN PATENT DOCUMENTS

EP 0 853 374 A1 7/1998
WO 2011036212 A1 3/2011

OTHER PUBLICATIONS

V. Issakov et al., Frequency Enhancement of a 40-nm CMOS Static Frequency Divider by Negative Capacitance, Proceedings of the 43rd European Microwave Conference, XP032535753, Oct. 7-10, 2013, pp. 1535-1538, Nuremberg, Germany.

(Continued)

Primary Examiner — William Hernandez
(74) Attorney, Agent, or Firm — Winston Hsu

(57) ABSTRACT

A regenerative frequency divider comprising an in-phase mixer circuit and a phase-shifted mixer circuit. At least one switching device of the in-phase mixer circuit is of a smaller scale than a corresponding switching device of the transconductance component of the in-phase mixer circuit. In some examples, at least one switching device within an input switching stage of the regenerative frequency divider forming part of the phase-shifted mixer circuit is of a smaller scale than a respective corresponding switching device within the input switching stage forming part of the in-phase mixer circuit. In some further examples, all switching devices within the phase-shifted mixer circuit are of a small scale than respective corresponding switching devices within the in-phase mixer circuit.

20 Claims, 7 Drawing Sheets

(58) Field of Classification Search
USPC ........ 327/117, 118, 119, 120, 355, 356, 358, 327/359, 361
See application file for complete search history.

(56) References Cited

U.S. PATENT DOCUMENTS

| | | | |
|---|---|---|---|
| 9,088,471 B1* | 7/2015 | Kim | .............. H04L 27/362 |
| 2006/0025095 A1 | 2/2006 | Rafi | |
| 2008/0113644 A1* | 5/2008 | Trotta | ............. H03D 7/1425 |
| | | | 455/333 |
| 2009/0068975 A1 | 3/2009 | Luong | |
| 2011/0018594 A1 | 1/2011 | Saverio | |

OTHER PUBLICATIONS

Hamid R. Rategh et al., "Superharmonic Injection-Locked Frequency Dividers", Jun. 1999, pp. 813-821, vol. 34, No. 6, IEEE Journal of Solid-State Circuits.

Jri Lee et al., "A 40-GHz Frequency Divider in 0.18-um CMOS Technology", Apr. 2004, pp. 594-601, vol. 39, No. 4, IEEE Journal of Solid-State Circuits.

L. J. Paciorek, "Injection Locking of Oscillators", Nov. 1965, pp. 1723-1727, vol. 53, No. 11, Proceedings of the IEEE.

Robert Adler, "A Study of Locking Phenomena in Oscillators", Jun. 1946, pp. 351-357, Proceedings of the I.R.E. and Waves and Electrons.

Robert D. Huntoon et al., "Synchronization of Oscillators", Dec. 1947, pp. 1415-1423, Proceedings of the I.R.E.

Cheema H. M. et al., A Ka Band, Static, MCML Frequency Divider, in Standard 90nm-CMOS LP for 60GHz Applications. Radio Frequency Integrated Circuits (RFIC) Symposium, 2007 IEEE, Jun. 3-5, 2007, pp. 541-544.

"International Search Report" mailed on Jan. 12, 2016 for International application No. PCT/SG2015/050445, International filing date:Nov. 12, 2015.

* cited by examiner

REGENERATIVE FREQUENCY DIVIDER

FIELD OF THE INVENTION

The field of this invention relates to a regenerative frequency divider.

BACKGROUND OF THE INVENTION

In the publication "Fractional-Frequency Generators Utilizing Regenerative Modulation" and published in the Journal: Proceedings of The Institute of Radio Engineers, vol. 27, no. 7, pp. 446-457, 1939, Ronald Lindsay Miller proposed the regenerative frequency divider whereby the output signal y(t) is mixed with the input signal x(t) and the result applied to a low-pass filter, as illustrated in FIG. 1. Under proper conditions, mixing the input and output signals produces sum and difference frequencies of $\omega in/2$ and $3\omega in/2$ at the output of the mixer. The low-pass filter filters out the signal component at $3\omega in/2$, whilst the signal component at $\omega in/2$ survives and circulates around the loop. Advantageously, because the device capacitances may be absorbed within the low-pass filter, this topology is able to achieve high-speed frequency division.

FIG. 2 illustrates an idealized model of an example of a regenerative frequency divider in which the low-pass filter is implemented by way of an RC filter, and a delay $\Delta T=\pi/\omega in$ is inserted into the loop to permit correct division. FIG. 3 illustrates a simplified circuit diagram of a bipolar realization of the regenerative frequency divider of FIG. 2, employing a double-balanced mixer arrangement whereby the delay $\Delta T$ is introduced at nodes X and Y through the emitter follower transistors $Q_7$ and $Q_8$, and at the collectors of transistors $Q_1$ and $Q_2$. Such double balanced mixers advantageously have symmetrical paths, with equally sized switching devices, for both inputs, so that only the product signal, and neither of the input signals, appears at the output.

In the publication "A 40-GHz Frequency Divider in 0.18-µm CMOS Technology", published in Solid-State Circuits, IEEE Journal (Volume: 39, Issue: 4), April 2004, pages 594-601, the authors Lee and Razavi noted that the topology of FIG. 2 is difficult to realize in CMOS technology due to:
  (i) the low transconductance of MOS devices requiring a large voltage drop across the load resistors so as to provide sufficient loop gain;
  (ii) source followers consuming substantial voltage headroom and attenuating the signal; and
  (iii) the limited bandwidth of the source followers preventing the divider from high-speed operation.

In order to overcome these difficulties with realizing the regenerative frequency divider in CMOS technology, and thus to enable the implementation of regenerative frequency dividers within integrated circuit devices, Lee and Razavi proposed employing an LC tank as the load of the regenerative frequency divider, effectively replacing the low-pass filter with a band-pass filter. FIG. 4 illustrates an idealized model of an example of a regenerative frequency divider employing an LC tank as the load. FIG. 5 illustrates a simplified circuit diagram of a simple double-balanced mixer implementation of the regenerative frequency divider of FIG. 4.

The double-balanced mixer configuration of the regenerative frequency divider illustrated in FIG. 5 is widely used in present day RFIC (Radio Frequency Integrated Circuit) applications due to its compact layout and high performance. However, for all resonant frequency dividers, there is typically a trade-off between power efficiency and locking range (the frequency range around the natural resonant frequency of the LC tank for which the divider works as intended). The double-balanced mixer implementation of the regenerative frequency divider illustrated in FIG. 5 provides a wide locking range, but has relatively low power efficiency.

SUMMARY OF THE INVENTION

In accordance with a first aspect of the present invention, there is provided a regenerative frequency divider comprising an in-phase mixer circuit and a phase-shifted mixer circuit. At least one switching device of the phase-shifted mixer circuit is of a smaller scale than a corresponding switching device of the in-phase mixer circuit.

In this manner, the power dissipation (static and dynamic) for the phase-shifted mixer circuit may be reduced, thereby improving the overall efficiency of the regenerative frequency divider. Significantly, when the present invention is applied to a double-balanced mixer implementation of a regenerative frequency divider, such as that illustrated in FIG. 5, the power efficiency of the regenerative frequency divider may be improved whilst maintaining the wide locking range of the double-balanced mixer implementation.

In some optional embodiments, at least one switching device within an input switching stage of the regenerative frequency divider forming part of the phase-shifted mixer circuit is of a smaller scale than a respective corresponding switching device within the input switching stage forming part of the in-phase mixer circuit. In some alternative embodiments, all switching devices within the phase-shifted mixer circuit may be of a small scale than respective corresponding switching devices within the in-phase mixer circuit.

In some optional embodiments, the regenerative frequency divider may comprise an in-phase/phase-shifted switching device size ratio of 4:1.

In some optional embodiments, the regenerative frequency divider may be a divide-by-two frequency divider.

In some optional embodiments, the regenerative frequency divider may further comprise an LC tank load.

In some optional embodiments, each of the in-phase and phase-shifted mixer circuits may be an injection locked frequency divider circuit, and the injection locked frequency divider circuits of the in-phase and phase-shifted mixer circuits may share a common LC tank load.

In some optional embodiments, the regenerative frequency divider may comprise:
  a mixer switching stage comprising an in-phase switching component forming part of the in-phase mixer circuit and a phase-shifted switching component forming part of the phase-shifted mixer circuit;
  a first input switching stage comprising at least one switching device forming part of the in-phase mixer circuit and at least one switching device forming a part of the phase-shifted mixer circuit; and
  at least one further input switching stage comprising at least one switching device forming part of the in-phase mixer circuit and at least one switching device forming a part of the phase-shifted mixer circuit.

In some optional embodiments, the regenerative frequency divider may be arranged to:
  perform a frequency division of a first input signal received by the first input switching stage, when the first input switching stage is enabled, and perform a frequency division of at least one further input signal received by the at least one further input switching stage, when the at least one further input switching stage is enabled.

In some optional embodiments, the regenerative frequency divider may be arranged to:

perform a frequency division of a first input signal received by the first input switching stage, when the first input switching stage is enabled, and operate as a buffer for at least one further input signal received by the at least one further input switching stage, when the at least one further input switching stage is enabled.

In accordance with a first aspect of the present invention, there is provided an integrated circuit device comprising a regenerative frequency divider according to the first aspect of the invention.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with examples of the present invention, there is provided a regenerative frequency divider comprising an in-phase mixer circuit and a phase-shifted mixer circuit. At least one switching device of the phase-shifted mixer circuit comprises a smaller scale than a corresponding switching device of the in-phase mixer circuit. In this manner, the power dissipation (static and dynamic) for the phase-shifted mixer circuit may be reduced, thereby improving the overall efficiency of the regenerative frequency divider.

Significantly, and as outlined in greater detail below, the use of such an asymmetrical regenerative frequency divider enables a more efficient regenerative frequency divider to be implemented for a target locking range, and/or a wider locking range to be achieved within a given frequency divider power budget.

Figure 1:
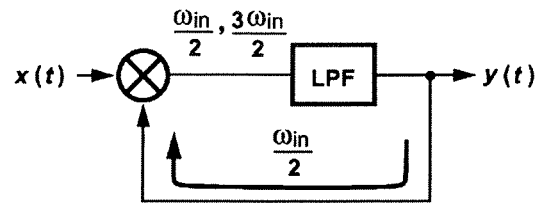
FIG. 1 illustrates a regenerative frequency divider design proposed by Ronald Lindsay Miller in the publication "Fractional-Frequency Generators Utilizing Regenerative Modulation" and published in the Journal: Proceedings of The Institute of Radio Engineers, vol. 27, no. 7, pp. 446-457, 1939.
Figure 2:
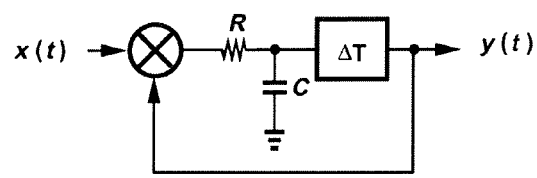
FIG. 2 illustrates an idealized model of an example of a regenerative frequency divider in which the low-pass filter is implemented by way of an RC filter, and a delay $\Delta T=\pi/\omega in$ is inserted into the loop to permit correct division.
Figure 3:
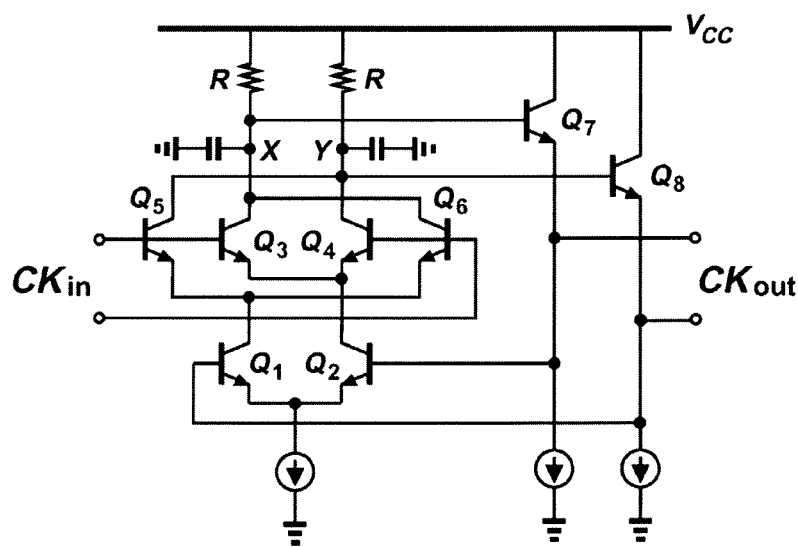
FIG. 3 illustrates a simplified circuit diagram of a bipolar realization of the regenerative frequency divider of FIG. 2.
Figure 4:
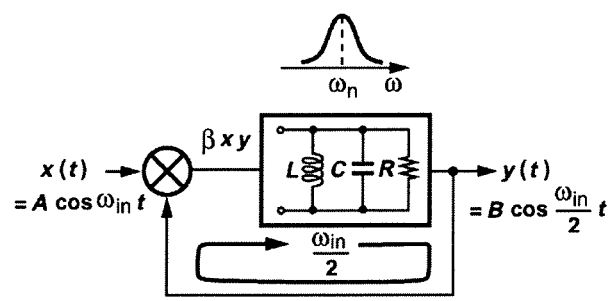
FIG. 4 illustrates an idealized model of an example of a regenerative frequency divider employing an LC tank as the load.
Figure 5:
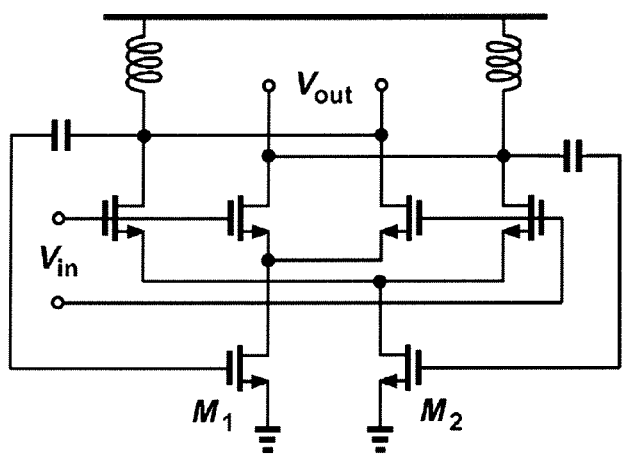
FIG. 5 illustrates a simplified circuit diagram of a simple double-balanced mixer implementation of the regenerative frequency divider of FIG. 4.
Figure 6:
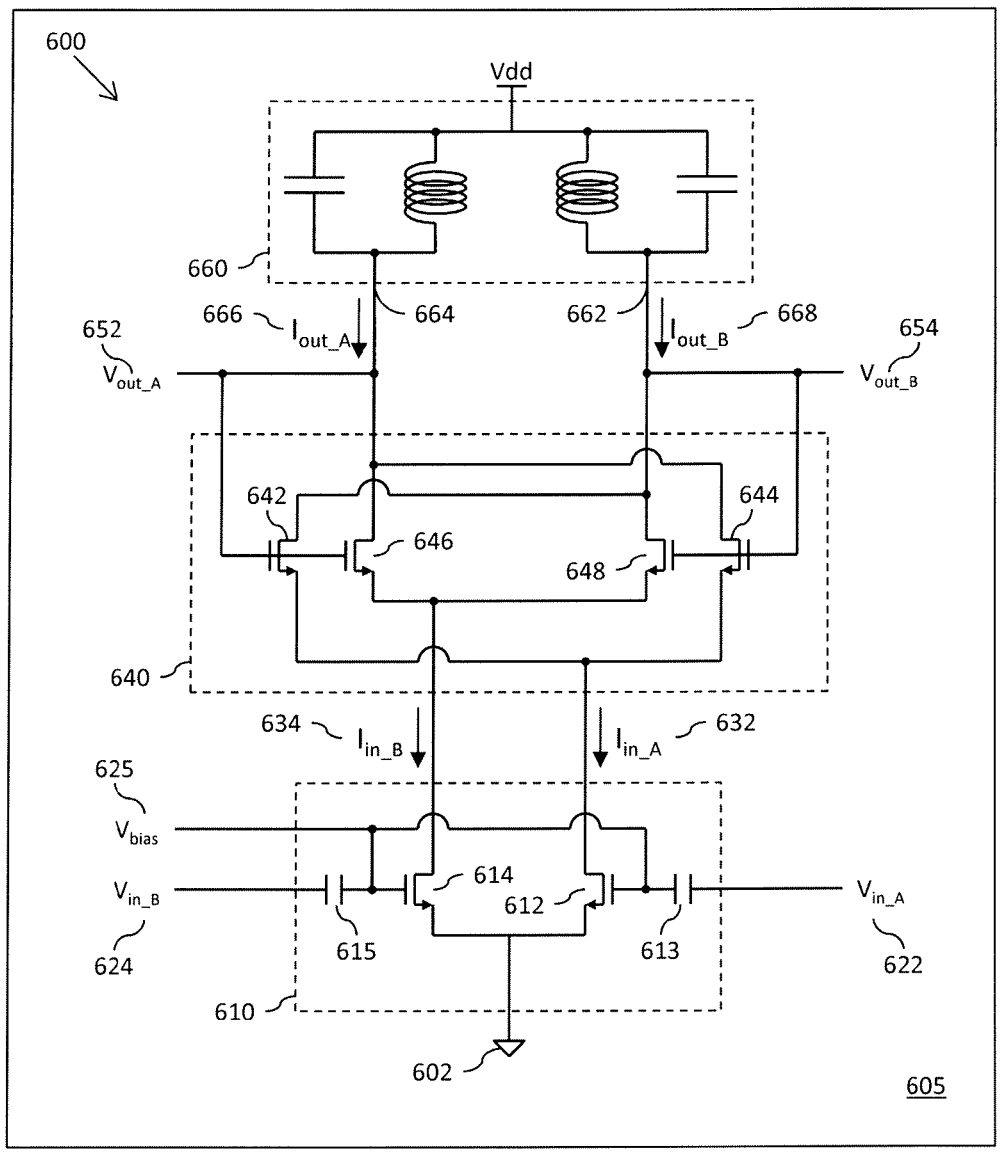
FIGS. 6 to 8 illustrate simplified circuit diagrams of an example of a regenerative frequency divider.

Referring now to FIG. 6, there is illustrated a simplified circuit diagram of an example of a regenerative frequency divider 600, which in the illustrated example is implemented within an integrated circuit device 605. The regenerative frequency divider 600 comprises a double (in-phase/phase-shifted) mixer architecture consisting of a input switching stage 610 and a mixer switching stage 640, with an LC tank, represented generally at 660, as the load of the regenerative frequency divider 600.

The input switching stage 610 is arranged to modulate an input current signal ($I_{in1\_A}$, $I_{in1\_B}$) 632, 634 in accordance with input voltage signals ($V_{in1\_A}$, $V_{in1\_B}$) 622, 624, and comprises a first (in-phase) switching device 612 and a second (phase-shifted) switching device 614. Source terminals of the first and second switching devices 612, 614 of the input switching stage 610 are coupled to a ground plane 602. In the illustrated example, switching devices 612, 614 are implemented by way of field effect transistor (FET) devices.

A gate terminal of the first FET devices device 612 of the input switching stage 610 is arranged to receive (via a decoupling capacitance 613) an in-phase component ($V_{in\_A}$) 622 of the input voltage signal. A DC bias voltage signal 625 is applied directly to the gate of the first FET devices device 612 of the input switching stage 610. An in-phase component ($I_{in\_A}$) 632 of the input current signal is regulated at the drain of the first FET devices device 612 of the input switching stage 610 by the combination of the DC bias voltage signal 625 and in-phase component ($V_{in\_A}$) 622 of the input voltage signal received at the gate of the first FET devices device 612 of the input switching stage 610.

A gate terminal of the second FET devices device 614 of the input switching stage 610 is arranged to receive (via a decoupling capacitance 615) a phase-shifted component ($V_{in\_B}$) 624 of the input voltage signal. For example, the phase-shifted component ($V_{in\_B}$) 624 of the input voltage signal may comprise the antiphase (i.e. phase-shifted by 180°) of the in-phase component ($V_{in\_A}$) 622 of the input voltage signal. The DC bias voltage signal 625 is also applied directly to the gate of the second FET devices device 614 of the input switching stage 610. A phase-shifted component ($I_{in\_B}$) 634 of the input current signal is regulated at the drain of the second FET devices device 614 of the input switching stage 610 by the combination of the DC bias voltage signal 625 and phase-shifted component ($V_{in\_A}$) 624 of the input voltage signal received at the gate of the second FET devices device 614 of the input switching stage 610.

Thus, the input switching stage 610 is arranged to modulate the input currents 632, 634 in accordance with the input voltage signals 622, 624 having a frequency $\omega_{in}$.

The mixer switching stage 640 is arranged to alternate the polarity with which the input current components 632, 634 are coupled to the LC tank 660 with a frequency defined by an oscillating signal received thereby. In the case of the regenerative frequency divider 600 illustrated in FIG. 6, the oscillating signal comprises the output signal ($V_{out\_A}$, $V_{out\_B}$) 652, 654 of the regenerative frequency divider 600, which is fed back into the mixer switching stage 640.

The mixer switching stage 640 comprises a first (in-phase) switching component 740 (FIG. 7) consisting of first and second switching devices 642, 644, which in the illustrated example are implemented by way of FET devices. Drain terminals of the first and second FET devices 642, 644 of the in-phase switching component 740 of the mixer switching stage 640 are coupled to first and second LC tank nodes 662, 664 respectively. Voltage levels at the LC tank nodes 662, 664 provide in-phase and phase-shifted (e.g. anti-phase) components ($V_{out\_A}$, $V_{out\_B}$) 652, 654 respectively of the output signal of the regenerative frequency divider 600. Source terminals of the first and second FET devices 642, 644 of the in-phase switching component 740 of the mixer switching stage 640 are coupled to the drain of the in-phase FET device 612 of the input switching stage 610. In this manner, the in-phase component ($I_{in\_A}$) 632 of the input current signal is coupled to the LC tank load 660 via the first and second FET devices 642, 644 of the in-phase switching component 740 of the mixer switching stage 640. Gate terminals of the first and second FET devices 642, 644 of the in-phase switching component 740 of the mixer switching stage 640 are arranged to receive in-phase and phase-shifted components respectively of the oscillating signal, which as mentioned above comprise the in-phase and phase-shifted components ($V_{out\_A}$, $V_{out\_B}$) 652, 654 of the output signal of the regenerative frequency divider 600. In this manner, the first and second FET devices 642, 644 of the in-phase switching component 740 of the mixer switching stage 640 are arranged to alternate to which of the first and second LC tank nodes 662, 664 the in-phase component ($I_{in\_A}$) 632 of the input current signal is coupled depending on the phase of the output signal of the regenerative frequency divider 600.

The mixer switching stage 640 further comprises a second (phase-shifted) switching component 840 (FIG. 8) consisting of first and second FET devices 646, 648. Drain terminals of the first and second FET devices 646, 648 of the phase-shifted switching component 840 of the mixer switching stage 640 are coupled to the first and second LC tank nodes 664, 662 respectively. Source terminals of the first and second FET devices 646, 648 of the phase-shifted switching component 840 of the mixer switching stage 640 are coupled to the drain of the phase-shifted FET device 614 of the input switching stage 610. In this manner, the phase-shifted component ($I_{in\_B}$) 634 of the input current signal is coupled to the LC tank load 660 via the first and second FET devices 646, 648 of the phase-shifted switching component 840 of the mixer switching stage 640. Gate terminals of the first and second FET devices 646, 648 of the phase-shifted switching component 840 of the mixer switching stage 640 are arranged to receive in-phase and phase-shifted components respectively of the oscillating signal, which as mentioned above comprise the in-phase and phase-shifted components ($V_{out\_A}$, $V_{out\_B}$) 652, 654 of the output signal of the regenerative frequency divider 600. In this manner, the first and second FET devices 646, 648 of the phase-shifted switching component 840 of the mixer switching stage 640 are arranged to alternate to which of the first and second LC tank nodes 662, 664 the phase-shifted component ($I_{in\_B}$) 634 of the input current signal is coupled depending on the phase of the output signal of the regenerative frequency divider 600.

In particular, the mixer switching stage 640 is arranged to couple the in-phase and phase-shifted components ($I_{in\_A}$) 632, ($I_{in\_B}$) 634 of the input current to the LC tank nodes 662, 664, and to alternate the polarity with which the in-phase and phase-shifted components ($I_{in\_A}$) 632 and ($I_{in\_B}$) 634 of the input current are coupled to the LC tank nodes 662, 664 at the frequency $\omega_{out}$ of the output signal 652, 654 of the regenerative frequency divider 600.

By alternating the polarity with which the input current 632, 634 is coupled to the LC tank nodes 662, 664 at the frequency $\omega_{out}$ of the output signal 652, 654, the mixer switching stage 640 generates an output current (comprising in-phase and phase-shifted components ($I_{out\_A}$) 666, ($I_{in\_B}$) 668) at the output of the regenerative frequency divider 600 equal to the input current 632, 634 multiplied by the output signal frequency $\omega_{out}$. Multiplying the input and output signals in this manner produces sum and difference frequencies of $\omega_{in}/2$ and $3\omega_{in}/2$ at the output 652, 654 of the regenerative frequency divider 600.

Figure 7:
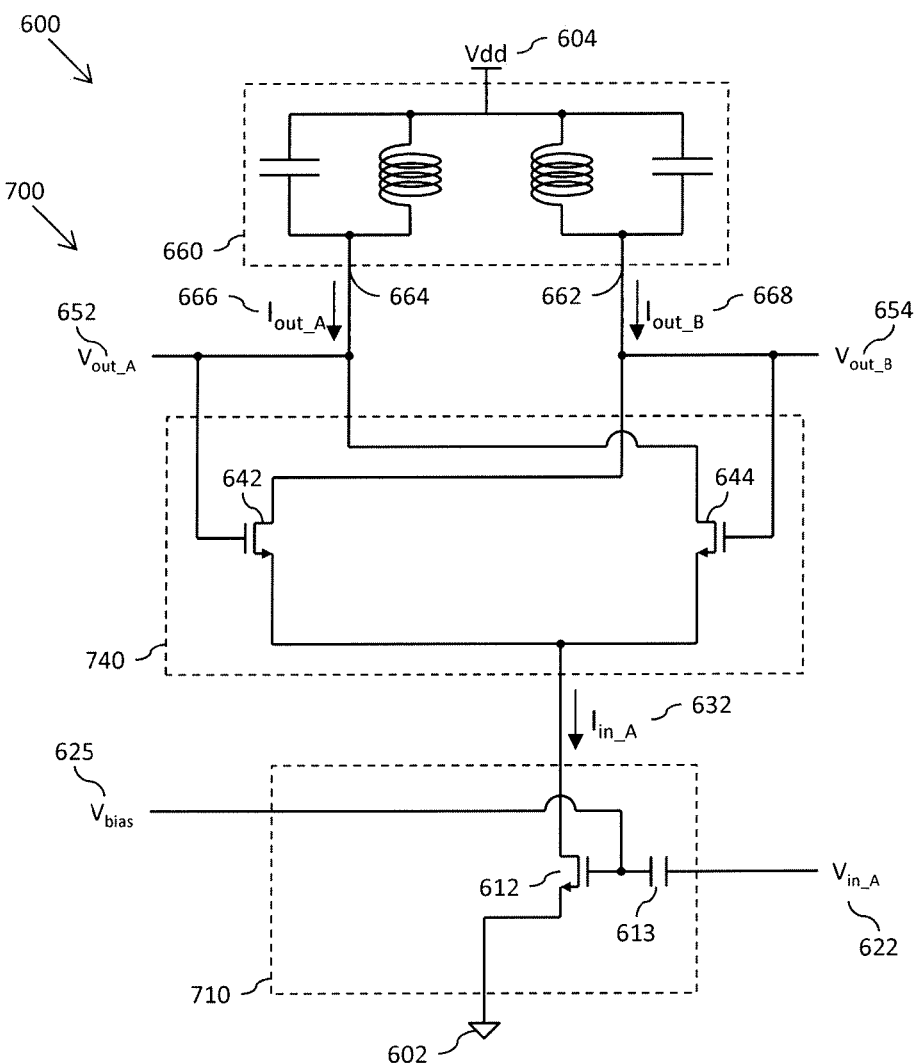
Figure 8:
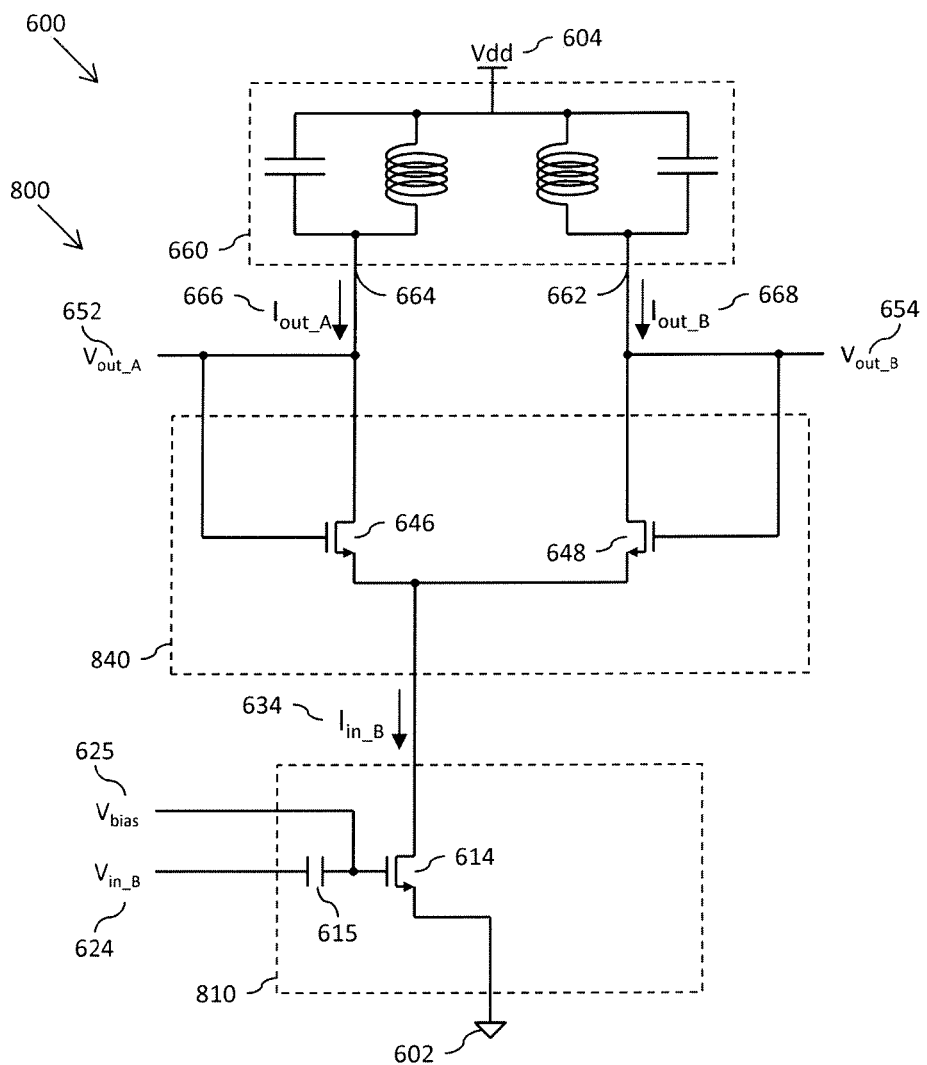

Conventionally, in a regenerative frequency divider comprising a double-balanced mixer configuration, the in-phase and phase-shifted signal paths are matched such that they comprise transistors of equal size (i.e. equal gate width and channel length). Regenerative frequency dividers operate most efficiently when operating at the resonant frequency of the LC tank load. The inventors have identified that the in-phase mixer circuit of the regenerative frequency divider 600, illustrated at 700 in FIG. 7, provides most of the drive to the LC tank load 660 when operating around the resonant frequency of the LC tank load 660. The phase-shifted mixer circuit of the regenerative frequency divider 660, illustrated at 800 in FIG. 8, provides drive to compensate when the regenerative frequency divider 600 is not operating at the resonant frequency of the LC tank load 660. Thus, the phase-shifted mixer circuit 800 provides the locking range for the regenerative frequency divider 660.

As illustrated in FIGS. 7 and 8, the in-phase and phase-shifted mixer circuits 700, 800 of the regenerative frequency divider 600 in the illustrated example comprise injection locked frequency divider circuits.

Accordingly, the inventors have recognised that when the regenerative frequency divider 600 is arranged to receive an input signal 622, 624 that causes the output signal frequency $\omega_{out}$ to equal the resonant frequency $\omega_{res}$ of the LC tank load 660 (i.e. $\omega_{in}/2=\omega_{res}$), because most of the drive to the LC tank load 660 s by the in-phase mixer circuit 700 of the regenerative frequency divider 660, the drive current provided by the phase-shifted mixer circuit 800 will not be as large as that provided by the in-phase mixer circuit 700. Accordingly, the transistor devices of the phase-shifted mixer circuit 800 may be scaled down (relative to the in-phase mixer circuit 700) with a relatively small reduction of the achievable locking range of the regenerative frequency divider 600. Advantageously, by scaling down the transistor devices of the phase-shifted mixer circuit 800, the overall power consumption of the regenerative frequency divider 600 may be reduced, and thus the efficiency of the circuit may be increased Thus, in accordance with examples of the present invention, it is proposed to provide the regenerative frequency divider 600 with a phase-shifted mixer circuit 800 having a input switching stage component 810 comprising a switching (e.g. FET) device 614 of a smaller scale (e.g. having a smaller gate width and/or channel length) than the corresponding switching device 612 of the input switching stage component 710 of the in-phase mixer circuit 700. In this manner, the power dissipation (static and dynamic) for the input switching stage component 810 of the phase-shifted mixer circuit 800 may be reduced, thereby improving the overall efficiency of the regenerative frequency divider 600.

It is further contemplated that the phase-shifted switching component 840 of the mixer switching stage 640, forming part of the phase-shifted mixer circuit 800 of the regenerative frequency divider 600, may also comprise switching devices 646, 648 of a smaller scale than corresponding switching devices 642, 644 of the in-phase switching component 740 of the mixer switching stage 640, forming part of the in-phase mixer circuit 700. In this manner, the power dissipation (static and dynamic) for the phase-shifted switching component 840 of the mixer switching stage 640 may also be reduced, thereby further improving the overall efficiency of the regenerative frequency divider 600.

Table 1 below comprises benchmarked performance data for a first example implementation of the present invention, whereby an asymmetrical regenerative frequency divider according to the present invention having an in-phase/phase-shifted FET size ratio of 4:1 (i.e. the FET devices within the in-phase mixer circuit 700 are approximately four times the size of the FET devices within the phase-shifted mixer circuit) is compared with a conventional injection-locked frequency divider (ILFD), with a 0.8V peak-to-peak input voltage signal and a target locking range of 14%.

TABLE 1

| Divide-by-2 structure: | Unit input capacitance | Ind. value/ equivalent parallel resistance | Locking range | Current consumption | Relative current consumption |
|---|---|---|---|---|---|
| ILFD (+25% MOS widths for matched input impedance) | 5 | 890 pH; 150 ohms | 13.1% | 5.232 | 125.3% |
| Asymmetrical Regenerative divider (4:1 ratio) | 5 | 890 pH; 254 ohms | 13.8% | 4.175 | 100.0% |

Significantly, to ensure comparable results between the two frequency divider structures, the two frequency divider structures were configured with the same input capacitance, and each divider structure was biased in such a way as to achieve substantially the same output amplitude on the tank, and to achieve comparable locking ranges.

As illustrated in Table 1 above, the current consumption of the conventional injection-locked frequency divider was 25.3% greater than for the asymmetrical regenerative frequency divider of the present invention.

Table 2 below comprises benchmarked performance data for a second example implementation of the present invention, whereby an asymmetrical regenerative frequency divider according to the present invention having an in-phase/phase-shifted FET size ratio of 4:1 is compared again with a conventional injection-locked frequency divider (ILFD), with a 0.8V peak-to-peak input voltage signal and a target locking range of 18%.

TABLE 2

| Divide-by-2 structure: | Unit input capacitance | Ind. value/ equivalent parallel resistance | Locking range | Current consumption | Relative current consumption |
|---|---|---|---|---|---|
| ILFD (+25% MOS widths for matched input impedance) | 5 | 890 pH; 100 ohms | 17.5% | 7.637 | 133.4% |
| Asymmetrical Regenerative divider (4:1 ratio) | 5 | 890 pH; 180 ohms | 17.8% | 5.724 | 100.0% |

Again, to ensure comparable results between the two frequency divider structures, the two frequency divider structures were configured with the same input capacitance, and each divider structure was biased in such a way as to achieve substantially the same output amplitude on the tank, and to achieve comparable locking ranges.

As illustrated in Table 2 above, the current consumption of the injection-locked frequency divider was 33.4% greater than for the asymmetrical regenerative frequency divider of the present invention.

Table 3 below comprises benchmarked performance data for a second example implementation of the present invention, whereby an asymmetrical regenerative frequency divider according to the present invention having an in-phase/phase-shifted FET size ratio of 4:1 is compared again with a conventional injection-locked frequency divider (ILFD) and a conventional regenerative frequency divider, with a 1V peak-to-peak input voltage signal and a target locking range of 14%.

TABLE 3

| Divide-by-2 structure: | Unit input capacitance | Ind. value/ equivalent parallel resistance | Locking range | Current consumption | Relative current consumption |
|---|---|---|---|---|---|
| ILFD (+25% MOS widths for matched input impedance) | 5 | 890 pH; 150 ohms | 13.8% | 5.202 | 125.7% |
| Conventional Regenerative divider | 8 | 890 pH; 254 ohms | 15.9% | 6.334 | 153.0% |
| Asymmetrical Regenerative divider (4:1 ratio) | 5 | 890 pH; 254 ohms | 13.8% | 4.139 | 100.0% |

As illustrated in Table 3 above, the current consumption of the conventional injection-locked frequency divider was 25.7% greater than for the asymmetrical regenerative frequency divider of the present invention, whilst the current consumption for the conventional regenerative frequency divider was 53% greater than for the asymmetrical regenerative frequency divider of the present invention.

Significantly, and as illustrated in Tables 1 to 3, the use of such an asymmetrical regenerative frequency divider enables a more efficient regenerative frequency divider to be implemented for a target locking range.

Figure 9:
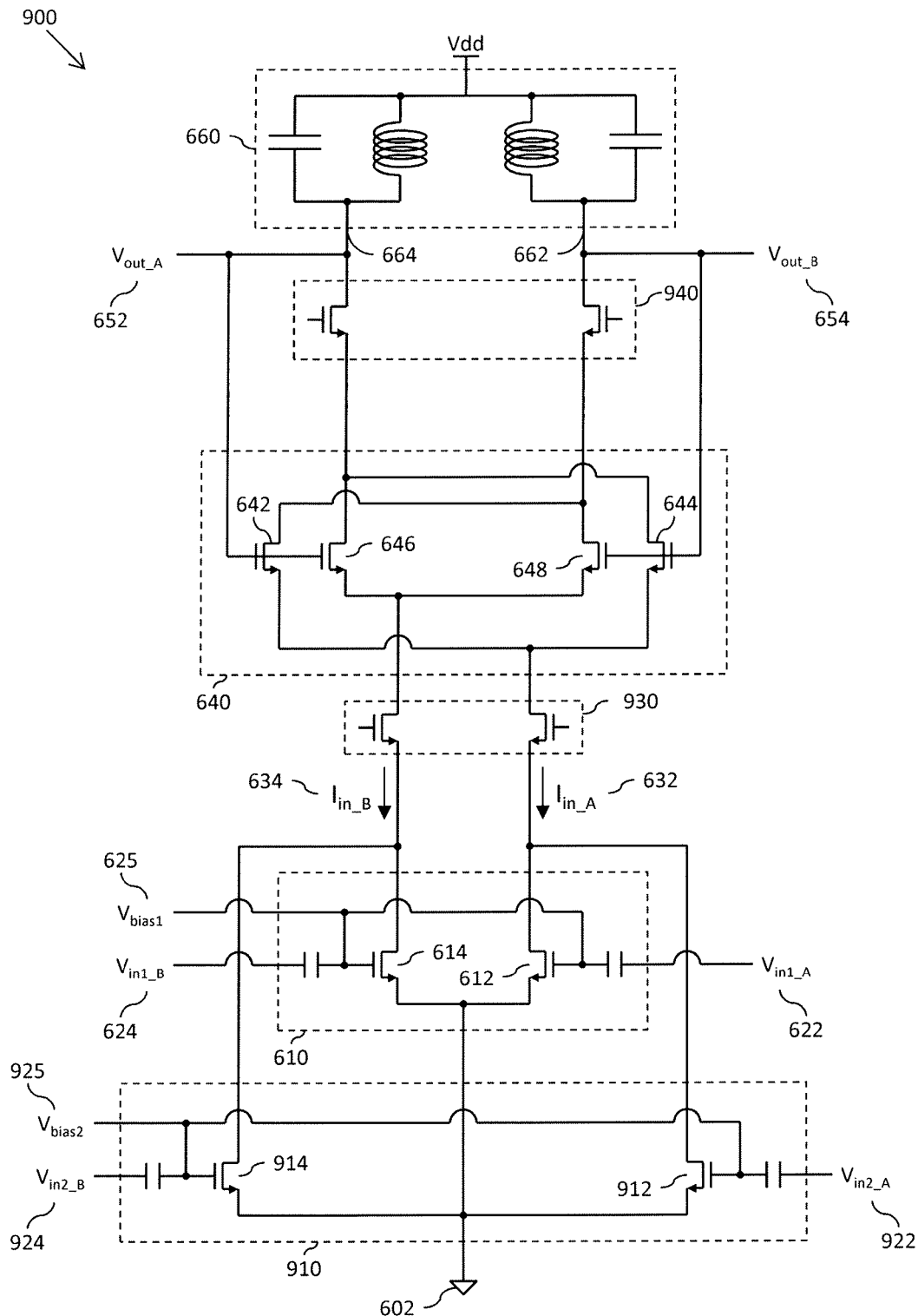
FIG. 9 illustrates a simplified circuit diagram of an alternative example of a regenerative frequency divider.

Referring now to FIG. 9, there is illustrated a simplified circuit diagram of an alternative example of a regenerative frequency divider 900. For clarity and ease of understanding, like reference numerals have been used to indicate components and elements of the regenerative frequency divider 900 illustrated in FIG. 9 that correspond to like components and elements within the regenerative frequency divider 600 illustrated in FIGS. 6 to 8. The regenerative frequency divider 900 of FIG. 9 comprises a first input switching stage 610 and a mixer switching stage 640, with an LC tank, represented generally at 660, as the load of the regenerative frequency divider 900.

The first input switching stage 610 is arranged to modulate input current signal ($I_{in\_A}$, $I_{in\_B}$) 632, 634 in accordance with input voltage signals ($V_{in1\_A}$, $V_{in1\_B}$) 622, 624 from a first source (not shown) having a frequency $\omega_{in}$, and comprises a first FET devices switching device 612 and a second FET devices switching device 614.

The mixer switching stage 640 is arranged to couple the LC tank nodes 662, 664 to the in-phase and phase-shifted components ($I_{in\_A}$) 632, ($I_{in\_B}$) 634 of the input current and to alternate the polarity with which the LC tank nodes 662, 664 are coupled to the in-phase and phase-shifted components ($I_{in\_A}$) 632 and ($I_{in\_B}$) 634 of the input current at the frequency $\omega_{out}$ of the output signal 652, 654 of the regenerative frequency divider 600. In this manner, the mixer switching stage 640 generates an output current (comprising in-phase and phase-shifted components ($I_{out\_A}$) 666, ($I_{out\_B}$) 668) equal to the input currents 632, 634 multiplied by the output signal frequency $\omega_{out}$. Multiplying the input and output signals in this manner produces sum and difference frequencies of $\omega_{in}/2$ and $3\omega_{in}/2$ at the output 652, 654 of the regenerative frequency divider 600.

In some applications, the regenerative frequency divider 900 may be required to perform frequency division for input signals from multiple sources; selectively performing such frequency division for one such input signal at any time. Multiplexing high frequency signals to select from which source to receive an input signal is difficult to achieve from an efficiency perspective.

To overcome this problem, the regenerative frequency divider 900 illustrated in FIG. 9 comprises a second input switching stage 910. The second input switching stage 910 is arranged to convert input voltage signals ($V_{in2\_A}$, $V_{in2\_B}$) 922, 924 from a second source (not shown) to input current signals ($I_{in\_A}$, $I_{in\_B}$) 632, 634, and comprises a first FET devices switching device 912 and a second FET devices switching device 914.

Each of the input switching stages 610, 910 may be enabled by configuring an appropriate bias voltage, by way of bias voltage signal 625 and bias voltage signal 925 respectively. Conversely, each of the input switching stages 610, 910 may be disabled by grounding the respective bias voltage signals 625, 925, or otherwise configuring a bias voltage that disables the respective FET devices 612, 614, 912, 914. In this manner, the regenerative frequency divider 900 may be selectively configured (through appropriate configuring of the bias voltage signals 625, 925) to perform frequency division for an input signal from one of a plurality of sources. Significantly, such a topology enables the multiplexing of the input high frequency voltage signals ($V_{in1\_A}$, $V_{in1\_B}$, $V_{in2\_A}$; $V_{in2\_B}$) 622, 624, 922, 924 to be performed in a very efficient, low cost manner. Thus, the regenerative frequency divider 900 of FIG. 9 is arranged to perform a frequency division (divide-by-two) of the first input voltage signal ($V_{in1\_A}$, $V_{in1\_B}$) 622, 624 received by the first of the input switching stages 610, when the first input switching stage 610 is enabled, and to perform a frequency division (divide-by-two) of the second input voltage signal ($V_{in2\_A}$, $V_{in2\_B}$) 922, 924 received by the second input switching stage 910, when the second input switching stage 910 is enabled.

In such an example of a regenerative frequency divider 900, the regenerative frequency divider 900 comprises an in-phase mixer circuit consisting of the FET devices 612, 912 of the input switching stages 610, 910 and the in-phase switching component (740 in FIG. 7) of the mixer switching stage 640 consisting of FET devices 642. 644. The regenerative frequency divider 900 further comprises a phase-shifted mixer circuit consisting of the FET devices 614, 914 of the input switching stages 610, 910 and the phase-shifted switching component (840 in FIG. 8) of the mixer switching stage 640 consisting of FET devices 646, 648.

In some examples, it is contemplated that the FET devices 614, 914 of each input switching stage 610, 910 within the phase-shifted mixer circuit of the regenerative frequency divider 900 are of a smaller scale than the FET devices 612, 912 of the input switching stages 610, 910 within the in-phase mixer circuit of the regenerative frequency divider 900.

It will be appreciated that the regenerative frequency divider 900 may comprise any number of required input switching stages, for example depending on the number of sources from which the regenerative frequency divider 900 is required to selectively receive input signals for frequency division.

Figure 10:
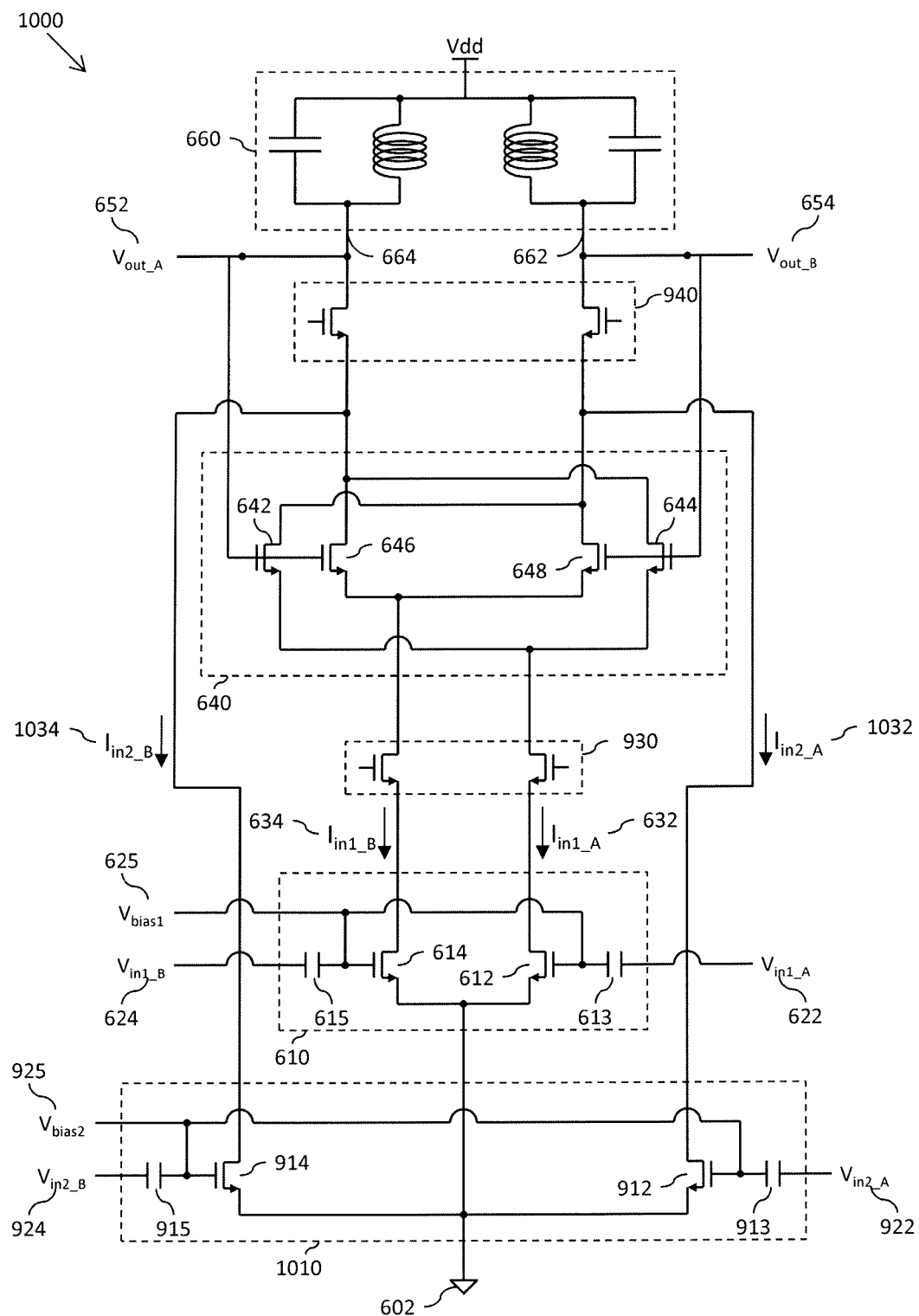
FIG. 10 illustrates a simplified circuit diagram of a further alternative example of a regenerative frequency divider.

Referring now to FIG. 10, there is illustrated a simplified circuit diagram of a further alternative example of a regenerative frequency divider 1000. For clarity and ease of understanding, like reference numerals have been used to indicate components and elements of the regenerative frequency divider 1000 illustrated in FIG. 10 that correspond to like components and elements within the regenerative frequency dividers 600, 900 illustrated in FIGS. 6 to 9. The regenerative frequency divider 1000 of FIG. 10 comprises a first input switching stage 610 and a mixer switching stage 640, with an LC tank, represented generally at 660, as the load of the regenerative frequency divider 1000.

The first input switching stage 610 is arranged to convert input voltage signals ($V_{in1\_A}$, $V_{in1\_B}$) 622, 624 from a first source (not shown) to input current signal ($I_{in\_A}$, $I_{in\_B}$) 632, 634, and comprises a first FET device 612 and a second FET device 614.

The mixer switching stage 640 is arranged to couple the LC tank nodes 662, 664 to the in-phase and phase-shifted components ($I_{in1\_A}$) 632, ($I_{in1\_B}$) 634 of the input current, and to alternate the polarity with which the LC tank nodes 662, 664 are coupled to the in-phase and phase-shifted components ($I_{in1\_A}$) 632 and ($I_{in1\_B}$) 634 of the input current at the frequency $\omega_{out}$ of the output signal 652, 654 of the regenerative frequency divider 600. In this manner, the mixer switching stage 640 generates an output current (comprising in-phase and phase-shifted components ($I_{out\_A}$)

666, ($I_{out\_B}$) 668) equal to the input currents 632, 634 multiplied by the output signal frequency $\omega_{out}$. Multiplying the input and output signals in this manner produces sum and difference frequencies of $\omega_{in}/2$ and $3\omega_{in}/2$ at the output 652, 654 of the regenerative frequency divider 600.

The regenerative frequency divider 1000 illustrated in FIG. 10 further comprises a second input switching stage 1010. The second input switching stage 1010 is arranged to modulate input current signals ($I_{in2\_A}$, $I_{in2\_B}$) 1032, 1034 in accordance with input voltage signals ($V_{in2\_A}$, $V_{in2\_B}$) 922, 924 from a second source (not shown) having a frequency $\omega_{in}$, and comprises a first FET device 912 and a second FET device 914. However, unlike the first input switching stage 610, the drains of the FET devices 912, 914 of the second input switching stage 610 are not coupled to the sources of the FET devices within the mixer switching stage 640, but rather are coupled above the mixer switching stage 640, between the mixer switching stage 640 and the LC tank load 660. In this manner, when the input switching stage 1010 is enabled (and the first stage 610 is disabled) the input current signals ($I_{in2\_A}$, $I_{in2\_B}$) 1032, 1034 are provided directly to the LC tank load 660, bypassing the mixer switching stage 640. By bypassing the mixer switching stage 640 in this manner, the input switching stage 1010 of FIG. 10 is arranged to cause the circuit 1000 of FIG. 10 to operate as a 'buffer', with the output signal frequency $\omega_{out}$ being equal to the input signal frequency $\omega_{in}$. Thus, the regenerative frequency divider 1000 of FIG. 10 is arranged to perform a frequency division (divide-by-two) of the first input voltage signal ($V_{in1\_A}$, $V_{in1\_B}$) 622, 624 received by the first input switching stage 610, when the first input switching stage 610 is enabled, and to operate as a buffer for the second input voltage signal ($V_{in2\_A}$, $V_{in2\_B}$) 922, 924 received by the second input switching stage 1010, when the second input switching stage 1010 is enabled.

In the examples illustrated in FIGS. 9 and 10, a first cascode stage 930 has been provided between the mixer switching stage 640 and the first input switching stage 610, and between the mixer switching stage 640 and the second input switching stage 910 in the example illustrated in FIG. 9. Such a cascode stage 930 provides isolation for the input switching stage(s) 610 (and 910 in FIG. 9), thereby preventing contamination of the input signals 622, 624 (and 922, 924 in FIG. 9) which could otherwise effect other components (not shown) that use or rely on the input signals 622, 624 (922, 924). It will be appreciated that such a cascode stage 930 could equally be provided between the mixer switching stage 640 and input switching stage 610 in the example illustrated in FIG. 6.

In the examples illustrated in FIGS. 9 and 10, a second cascode stage 940 has also been provided between the LC tank load 660 and the mixer switching stage 640. Such a cascode stage 940 isolates the low output impedance of the mixer switching stage 640 from the LC tank load 660, which operates more efficiently (i.e. consumes less power due to achieving a better quality factor for the LC tank load 660) when presented with a high impedance.

Such a cascode stage 940 also provides isolation for the FET devices 642, 644, 646, 648 within the mixer switching stage 640 from the high voltage swing generated by the LC tank load 660. It will be appreciated that such a cascode stage 940 could equally be provided between the mixer switching stage 640 and input switching stage 610 in the example illustrated in FIG. 6.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may, for the most part, be implemented using electronic components known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A regenerative frequency divider comprising:
an in-phase mixer circuit, and
a phase-shifted mixer circuit;
wherein at least one switching device of the phase-shifted mixer circuit is of a smaller scale than a corresponding switching device of the in-phase mixer circuit.

2. The regenerative frequency divider of claim 1, wherein at least one switching device within an input switching stage of the regenerative frequency divider forming part of the phase-shifted mixer circuit is of a smaller scale than a respective corresponding switching device within the input switching stage forming part of the in-phase mixer circuit.

3. The regenerative frequency divider of claim 2, wherein all switching devices within the phase-shifted mixer circuit are of a smaller scale than respective corresponding switching devices within the in-phase mixer circuit.

4. The regenerative frequency divider of claim 1 comprising an in-phase/phase-shifted switching device size ratio of 4:1.

5. The regenerative frequency divider of claim 1, wherein the regenerative frequency divider is a divide-by-two frequency divider.

6. The regenerative frequency divider of claim 1 further comprising an LC tank load.

7. The regenerative frequency divider of claim 1, wherein each of the in-phase and phase-shifted mixer circuits is an injection locked frequency divider circuit, and the injection locked frequency divider circuits of the in-phase and phase-shifted mixer circuits share a common LC tank load.

8. The regenerative frequency divider of claim 1 comprising:
a mixer switching stage comprising an in-phase switching component forming part of the in-phase mixer circuit and a phase-shifted switching component forming part of the phase-shifted mixer circuit;
a first input switching stage comprising at least one switching device forming part of the in-phase mixer circuit and at least one switching device forming a part of the phase-shifted mixer circuit; and
at least one further input switching stage comprising at least one switching device forming part of the in-phase mixer circuit and at least one switching device forming a part of the phase-shifted mixer circuit.

9. The regenerative frequency divider of claim 8, wherein the regenerative frequency divider is arranged to:
perform a frequency division of a first input signal received by the first input switching stage, when the first input switching stage is enabled, and
perform a frequency division of at least one further input signal received by the at least one further input switching stage, when the at least one further input switching stage is enabled.

10. The regenerative frequency divider of claim 8, wherein the regenerative frequency divider is arranged to:
perform a frequency division of a first input signal received by the first input switching stage, when the first input switching stage is enabled, and
operate as a buffer for at least one further input signal received by the at least one further input switching stage, when the at least one further input switching stage is enabled.

11. An integrated circuit device comprising a regenerative frequency divider; the regenerative frequency divider comprising:
an in-phase mixer circuit, and
a phase-shifted mixer circuit;
wherein at least one switching device of the phase-shifted mixer circuit is of a smaller scale than a corresponding switching device of the in-phase mixer circuit.

12. The integrated circuit device of claim 11, wherein at least one switching device within an input switching stage of the regenerative frequency divider forming part of the phase-shifted mixer circuit is of a smaller scale than a respective corresponding switching device within the input switching stage forming part of the in-phase mixer circuit.

13. The integrated circuit device of claim 12, wherein all switching devices within the phase-shifted mixer circuit are of a smaller scale than respective corresponding switching devices within the in-phase mixer circuit.

14. The integrated circuit device of claim 11, wherein the regenerative frequency divider comprises an in-phase/phase-shifted switching device size ratio of 4:1.

15. The integrated circuit device of claim 11, wherein the regenerative frequency divider is a divide-by-two frequency divider.

16. The integrated circuit device of claim 11, wherein the regenerative frequency divider further comprises an LC tank load.

17. The integrated circuit device of claim 11, wherein each of the in-phase and phase-shifted mixer circuits is an injection locked frequency divider circuit, and the injection locked frequency divider circuits of the in-phase and phase-shifted mixer circuits share a common LC tank load.

18. The integrated circuit device of claim 11, wherein the regenerative frequency divider comprises:
a mixer switching stage comprising an in-phase switching component forming part of the in-phase mixer circuit and a phase-shifted switching component forming part of the phase-shifted mixer circuit;
a first input switching stage comprising at least one switching device forming part of the in-phase mixer circuit and at least one switching device forming a part of the phase-shifted mixer circuit; and
at least one further input switching stage comprising at least one switching device forming part of the in-phase mixer circuit and at least one switching device forming a part of the phase-shifted mixer circuit.

19. The integrated circuit device of claim 18, wherein the regenerative frequency divider is arranged to:
perform a frequency division of a first input signal received by the first input switching stage, when the first input switching stage is enabled, and
perform a frequency division of at least one further input signal received by the at least one further input switching stage, when the at least one further input switching stage is enabled.

20. The integrated circuit device of claim 18, wherein the regenerative frequency divider is arranged to:
perform a frequency division of a first input signal received by the first input switching stage, when the first input switching stage is enabled, and
operate as a buffer for at least one further input signal received by the at least one further input switching stage, when the at least one further input switching stage is enabled.

* * * * *